(12) United States Patent
Sherrer

(10) Patent No.: US 6,698,295 B1
(45) Date of Patent: Mar. 2, 2004

(54) MICROSTRUCTURES COMPRISING SILICON NITRIDE LAYER AND THIN CONDUCTIVE POLYSILICON LAYER

(75) Inventor: David W. Sherrer, Radford, VA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 09/541,394

(22) Filed: Mar. 31, 2000

(51) Int. Cl.[7] .............................. G01L 9/00; G01L 9/16
(52) U.S. Cl. ........................................................ 73/754
(58) Field of Search ........................ 73/754, 756, 722, 73/728, 721, 720, 727; 438/51, 52, 53, 456, 415, 5, 10, 14, 17, 577, 578, 670, 951; 338/2, 4, 5, 42; 257/254, 415

(56) References Cited

U.S. PATENT DOCUMENTS

| | | | |
|---|---|---|---|
| 4,649,630 A | | 3/1987 | Boland et al. |
| 4,853,669 A | * | 8/1989 | Guckel et al. ................. 338/4 |
| 4,891,984 A | | 1/1990 | Fujii et al. |
| 4,922,756 A | | 5/1990 | Henrion |
| 4,996,082 A | * | 2/1991 | Guckel et al. ................ 427/99 |
| 5,095,401 A | | 3/1992 | Zavracky et al. |
| 5,209,119 A | * | 5/1993 | Polla et al. .................... 73/723 |
| 5,252,881 A | | 10/1993 | Muller et al. |
| 5,275,055 A | | 1/1994 | Zook et al. |
| 5,367,217 A | | 11/1994 | Norling |
| 5,417,115 A | | 5/1995 | Burns |
| 5,461,916 A | | 10/1995 | Fujii et al. |
| 5,475,318 A | | 12/1995 | Marcus et al. |
| 5,489,556 A | * | 2/1996 | Li et al. ....................... 437/228 |
| 5,537,083 A | | 7/1996 | Lin et al. |
| 5,594,166 A | | 1/1997 | Itoh et al. |
| 5,640,039 A | | 6/1997 | Chau et al. |
| 5,645,684 A | | 7/1997 | Keller |
| 5,658,698 A | * | 8/1997 | Yagi et al. ..................... 430/11 |
| 5,683,591 A | | 11/1997 | Offenberg |
| 5,772,322 A | | 6/1998 | Burns et al. |
| 5,796,152 A | * | 8/1998 | Carr et al. ..................... 257/415 |
| 5,808,210 A | | 9/1998 | Herb et al. |
| 5,808,331 A | * | 9/1998 | Zhang et al. ................. 257/254 |
| 5,858,809 A | | 1/1999 | Chau et al. |
| 5,866,805 A | | 2/1999 | Han et al. |
| 5,870,007 A | * | 2/1999 | Carr et al. ..................... 333/262 |
| 5,883,310 A | * | 3/1999 | Ho et al. ........................ 73/766 |
| 5,922,212 A | | 7/1999 | Kano et al. |
| 5,936,159 A | | 8/1999 | Kano et al. |
| 5,943,155 A | | 8/1999 | Goossen ....................... 359/247 |
| 5,959,376 A | | 9/1999 | Allen |
| 5,973,394 A | | 10/1999 | Slocum et al. |
| 5,987,989 A | | 11/1999 | Yamamoto et al. |
| 6,012,336 A | * | 1/2000 | Eaton et al. ................... 73/754 |
| 6,090,665 A | * | 7/2000 | Kerber .......................... 438/257 |
| 6,146,917 A | * | 11/2000 | Zhang et al. .................. 438/51 |
| 6,238,935 B1 | * | 5/2001 | Egley et al. .................... 438/5 |

* cited by examiner

Primary Examiner—William Oen
(74) Attorney, Agent, or Firm—Niels Haun; Jonathan D. Baskin

(57) ABSTRACT

Surface micromachined structures having a relatively thick silicon nitride layer and a relatively thin conductive polysilicon layer bonded together. Preferably, the silicon nitride layer and conductive polysilicon layer are made in the same low pressure chemical vapor deposition (LPCVD) step. The polysilicon layer is thin enough compared to the silicon nitride layer so that the mechanical properties of the microstructure are primarily determined by the silicon nitride layer. This provides superior mechanical properties for many applications. The thin conductive polysilicon layer provides conductivity for the microstructure (silicon nitride is an electrical insulator). The polysilicon layer has a thickness less than ⅕ the thickness of the silicon nitride layer. Preferably, the polysilicon layer is much thinner than this. The polysilicon layer can be located on a top surface or bottom surface of the silicon nitride layer. Also, the polysilicon layer can be located within the silicon nitride layer. Alternatively, the polysilicon layer covers the sidewalls of the silicon nitride layer, or completely encloses the silicon nitride layer.

36 Claims, 6 Drawing Sheets

MICROSTRUCTURES COMPRISING SILICON NITRIDE LAYER AND THIN CONDUCTIVE POLYSILICON LAYER

FIELD OF THE INVENTION

The present invention relates generally to micromachined structures. More specifically, the present invention relates to released or suspended multilayer microstructures having a thick layer of rigid dielectric material (e.g. silicon nitride) and a thin layer of conductive polysilicon.

BACKGROUND OF THE INVENTION

Released microstructures are commonly used in a variety of sensors, actuators and other useful devices. Released microstructures are suspended above a substrate (e.g. silicon) to which they are usually attached. Examples of released microstructures include comb drives, cantilevers, electrostatic motors and a wide variety of sensors (e.g. pressure sensors, magnetic sensors).

Released microstructures are often made from polysilicon. This is because polysilicon can be conformally deposited on many surfaces and it can be doped to provide conductivity. Also, polysilicon is easily released because there are a number of supporting materials available that can be selectively etched from under a polysilicon layer (e.g. phosphosilicate glass, PSG). However, polysilicon has the great disadvantage that deposited polysilicon layers have relatively high internal stress. Therefore, polysilicon structures tend to distort and bend when released. The tendency of polysilicon to bend after release is undesirable for making precision micromachined structures.

Polysilicon can be annealed to reduce internal stress and reduce bending. However, polysilicon annealing techniques are cumbersome and can interfere with other process steps required in making a useful device. It would be an improvement in the art to obviate polysilicon annealing in making certain released microstructures.

Another disadvantage of polysilicon is that it can have a relatively low strength.

Due to these disadvantages of polysilicon, silicon nitride is sometimes used instead for released microstructures. Low stress silicon nitride films are readily formed without annealing. Also, silicon-rich silicon nitride is rigid, strong, and can be released from a variety of supporting layers. A problem with silicon nitride is that it is an electrical insulator. Devices that require a conductive released microstructure cannot be made from silicon nitride.

Therefore, there is a need in the art for an electrically conductive material that can form low internal stress, high strength microstructures. Such a material could be used in a wide variety of released microstructures.

U.S. Pat. No. 5,936,159 to Kano et al. Discloses a released cantilever having a three-layer structure. The middle layer is a very thin stress relieving layer that tends to equalize stress in the cantilever, thereby reducing bending. In a preferred embodiment, a stress relieving layer tens of angstroms thick is disposed between thicker films of polysilicon.

U.S. Pat. No. 5,475,318 to Marcus et al. discloses a micromachined cantilever probe for contacting integrated circuits. The cantilever has two layers with different coefficients of expansion. When heated, the cantilever bends to provide electrical contact with a nearby electrical pad.

U.S. Pat. No. 5,866,805 to Han et al. discloses a cantilever having a magnetic thin film. The magnetic thin film provides magnetic coupling to a nearby electromagnet. The electromagnet can cause the cantilever to vibrate for use in 'AC mode' force microscopy. A second layer is applied to the cantilever to reduce bending of the cantilever.

U.S. Pat. No. 5,796,152 to Carr et al. Discloses a cantilever having to separately bendable actuator sections, Each section can be heated separately. In this way, the cantilever can be caused to bend in complex shapes such as S-curves.

OBJECTS AND ADVANTAGES OF THE INVENTION

Accordingly, it is a primary object of the present invention to provide a released microstructure that:
1) has a very low internal stress and experiences minimal bending or distortion when released;
2) is electrically conductive;
3) can be made from materials easily applied using LPCVD or PECVD processes;
4) does not require annealing to achieve low internal stress;
5) can rapidly dissipate electrostatic charge.

These and other objects and advantages will be apparent upon reading the following description and accompanying drawings.

SUMMARY OF THE INVENTION

These objects and advantages are attained by a microstructure having a silicon nitride layer and a conductive polysilicon layer attached to the silicon nitride layer. The polysilicon layer has a thickness less than ⅕ the thickness of the silicon nitride layer. The mechanical properties of the microstructure are primarily determined by the silicon nitride because the polysilicon is so thin.

More preferably, the conductive polysilicon layer thickness is less than 1/10, 1/20, 1/30, 1/50, or 1/100 the silicon nitride layer thickness.

The silicon nitride layer and polysilicon layer can have a range of thicknesses. Preferably, the silicon nitride layer thickness is in the range of about 2–50 microns, and the polysilicon layer thickness is in the range of 5–50 nanometers.

Preferably, the polysilicon layer has a dopant concentration of at least $10^{17}$ atoms per cubic centimeter. More preferably, the polysilicon has a dopant concentration of at least $10^{18}$ or $10^{20}$ atoms per cubic centimeter.

Also preferably, the silicon nitride and polysilicon layers are LPCVD deposited layers. Preferably they are deposited in the same LPCVD step. The silicon nitride and polysilicon layers can also be deposited using plasma-enhanced chemical vapor deposition (PECVD).

Also, the polysilicon layer can be disposed on top of the silicon nitride layer or on the bottom of the silicon nitride layer. Also, the polysilicon layer can be disposed within the silicon nitride layer.

Also, the polysilicon layer can cover sidewalls of the silicon nitride layer. Also, the silicon nitride layer can be enclosed by the polysilicon layer. Also, multiple polysilicon layers can be disposed within the silicon nitride layer.

DETAILED DESCRIPTION

The present invention provides released microstructures having a silicon nitride layer combined with a much thinner layer of conductive polysilicon (e.g., $1/5$, $1/10$, or $1/100$ the thickness of the silicon nitride layer). The thin polysilicon layer can be located on the top side or bottom side of the silicon nitride layer, or within the silicon nitride layer. The relatively thick silicon nitride layer provides good mechanical properties for the microstructure (e.g., high strength, low internal stress, high rigidity). The polysilicon layer is sufficiently thin so that it does not adversely affect the mechanical properties of the microstructure. The thin polysilicon layer provides electrical conductivity so that the microstructure can be used in electrostatic actuators, piezoresistive devices and other microelectromechanical (MEM), or microelectrooptomechanical devices. Preferably, the polysilicon layer is highly conductive (i.e., heavily doped) so that it can be exceptionally thin (e.g., less than 25 nanometers) and still provide good surface conductivity. Of course, the required conductivity and thickness of the polysilicon layer depend upon the microstructure design and its application.

Figure 1:
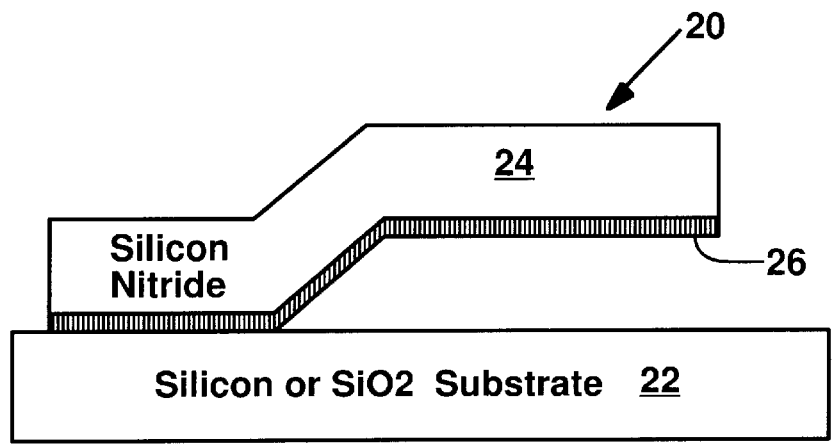
FIG. 1 shows a cantilever according to the present invention.

FIG. 1 shows a simple cantilever 20 according to the present invention. The cantilever 20 is attached to a substrate 22 made of silicon or silica, for example (other substrates can also be used). The cantilever comprises a relatively thick silicon nitride layer 24, and a relatively thin conductive polysilicon layer 26 on a bottom side of the cantilever. The silicon nitride layer 24 and the polysilicon layer 26 are bonded together; both can be formed using low pressure chemical vapor deposition (LPCVD) or plasma-enhanced chemical vapor deposition. LPCVD is preferred. The polysilicon layer 26 is thin enough relative to the silicon nitride layer 24 such that the mechanical properties (e.g., strength, internal stress, rigidity) of the cantilever are primarily determined by the silicon nitride layer. Silicon nitride is an insulator; the electrical conductivity of the cantilever is primarily determined by the polysilicon layer 26.

According to the present invention, the polysilicon layer 26 has a thickness less than $1/5$ the thickness of the silicon nitride layer 24. Preferably, the polysilicon layer thickness is less than $1/10$, $1/50$, or $1/100$ the silicon nitride layer thickness. Thin polysilicon layers are preferred because they have a small affect on the mechanical properties of the cantilever or microstructure.

The polysilicon layer 26 is conductive. Preferably, the polysilicon layer has a dopant concentration greater than about $10^{17}$ per cubic centimeter, more preferably, greater than $10^{18}$ or $10^{20}$ atoms per cubic centimeter. The polysilicon can be doped with phosphorous, boron, or any other dopant that imparts conductivity. Preferably, the polysilicon is doped with a material that can be incorporated during LPCVD or PECVD deposition (e.g., phosphorous). The dopant level in the polysilicon can have a wide range of values. The dopant level should be high enough to provide adequate surface conductivity necessary for the intended use of the microstructure (e.g., electrostatic actuation, piezoresistive sensing, or electrostatic charge dissipation). Relatively high dopant concentrations should be used in thin polysilicon layers, and lower dopant concentrations can be used in thick polysilicon layers. In many microelectromechanical applications, surface conductivity (Ohms per square) of the polysilicon layer is the important consideration.

Figure 2:
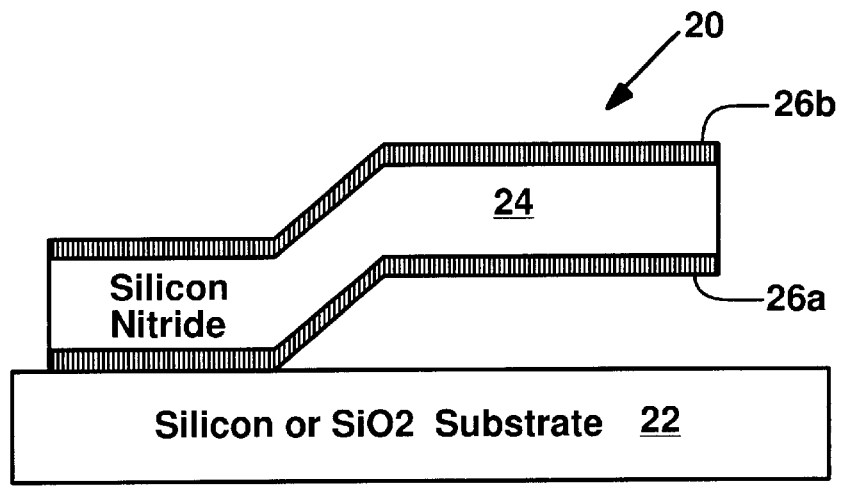
FIG. 2 shows an alternative embodiment having both top and bottom polysilicon layers.

FIG. 2 shows an alternative embodiment of the present invention where the cantilever 20 has a first conductive polysilicon layer 26a and a second conductive polysilicon layer 26b. The silicon nitride layer 24 is sandwiched between the polysilicon layers 26a, 26b. Each polysilicon layer has a thickness less than $1/5$ the thickness of the silicon nitride layer. More preferably, each polysilicon layer is less than $1/10$ or $1/20$ the thickness of the silicon nitride layer. Preferably, the thicknesses of the polysilicon layers 26a, 26b are equal. The polysilicon layers 26a, 26b are thin enough so that the mechanical properties of the cantilever are primarily determined by the silicon nitride layer 24.

Figure 3:
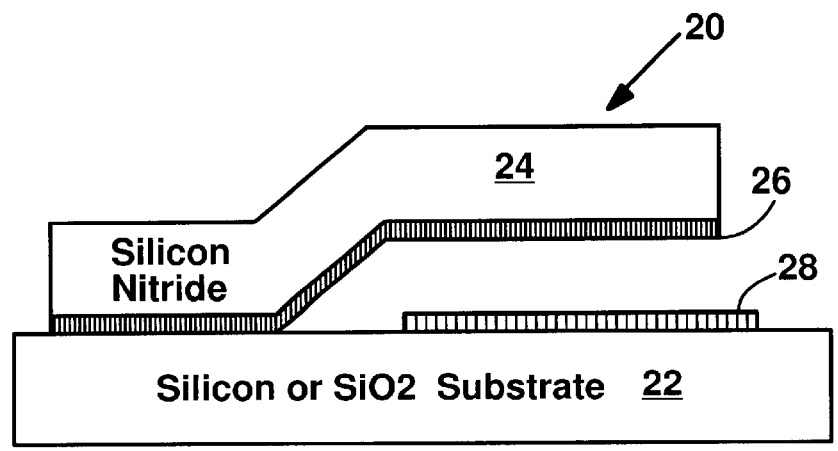
FIG. 3 shows a cantilever and a conductive pad for electrostatic actuation of the cantilever.

FIG. 3 shows a cantilever device of the present invention in operation. A conductive pad 28 disposed on the substrate 22 is electrostatically coupled to the conductive polysilicon layer 26. Applying a voltage between the conductive pad 28 and the polysilicon layer 26 causes the cantilever to move with respect to the substrate 22. The polysilicon layer 26 also assures that electrostatic charges in the silicon nitride layer 24 are rapidly dissipated. As noted, the mechanical properties of the cantilever are primarily determined by the silicon nitride layer 24.

Figure 4:
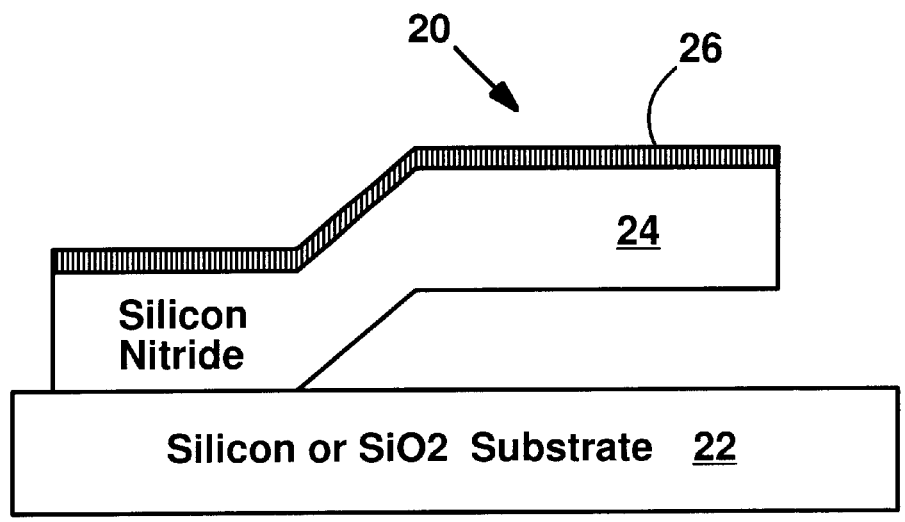
FIG. 4 shows a cantilever with a polysilicon layer on the top surface.

FIG. 4 shows another embodiment of the present invention where the conductive polysilicon layer 26 is disposed on top of the silicon nitride layer 24.

Preferably, the silicon nitride layer 24 comprises silicon rich (SiN), low stress silicon nitride. Other stoichiometries can also be used. Preferably, the internal stress in the silicon nitride layers is in the range of –300 to +300 mega Pascals. More preferably, the silicon nitride layer has an internal tensile stress in the range of 20–300 megapascals.

FIGS. 5a–5e illustrate a preferred method for making the microstructures of the present invention. First, in FIG. 5a, phosphosilicate glass (PSG) 30 is deposited and patterned on a substrate 32 (e.g., a silicon or quartz substrate). There are many well known processes for depositing and patterning PSG.

Figure 5A:
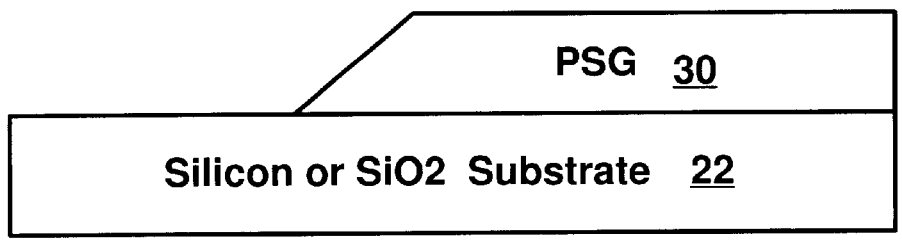
FIGS. 5a–e illustrate a preferred method for making the present invention.
Figure 5B:
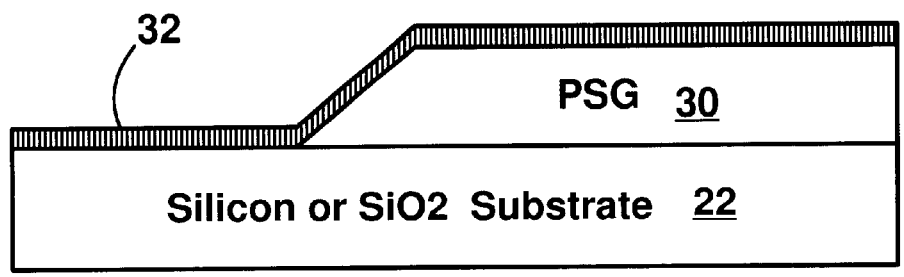

Next, in FIG. 5b, polysilicon 32 is deposited conformally on the PSG 30. Preferably, the polysilicon is deposited by low-pressure chemical vapor deposition. Also preferably, the polysilicon 32 is doped as it is deposited. For example, the polysilicon can be doped with phosphorous by flowing phosphene ($PH_3$) in the CVD furnace during polysilicon deposition. Techniques for LPCVD deposition of doped polysilicon are known in the art.

Figure 5C:
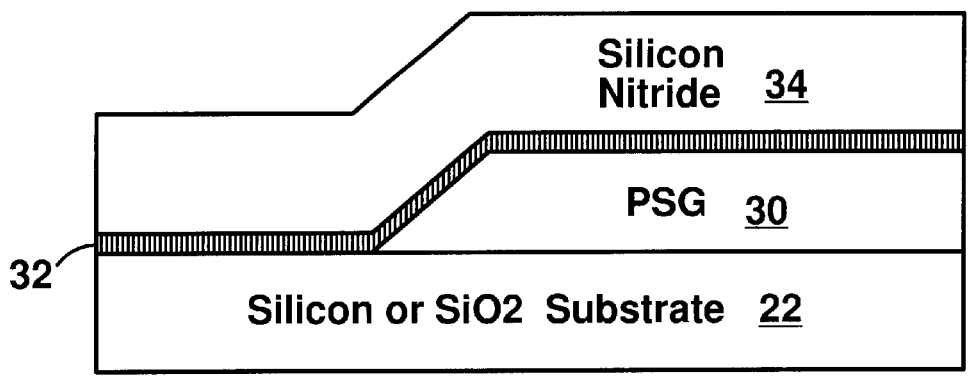

Next, in FIG. 5c, silicon nitride 34 is deposited on top of the polysilicon 32. Preferably, the silicon nitride is deposited using LPCVD. Preferably, the polysilicon 32 and the silicon nitride 34 are deposited in the same LPCVD step. During deposition, gas flow is changed from silane/phosphene (for doped polySi) to silane/ammonia for silicon nitride. Alternatively, the gas flow can be changed relatively slowly so that a compositional transition region is formed between the polysilicon layer 32 and silicon nitride layer 34. In this case, the transition region will have an intermediate composition between silicon nitride and polysilicon.

Figure 5D:
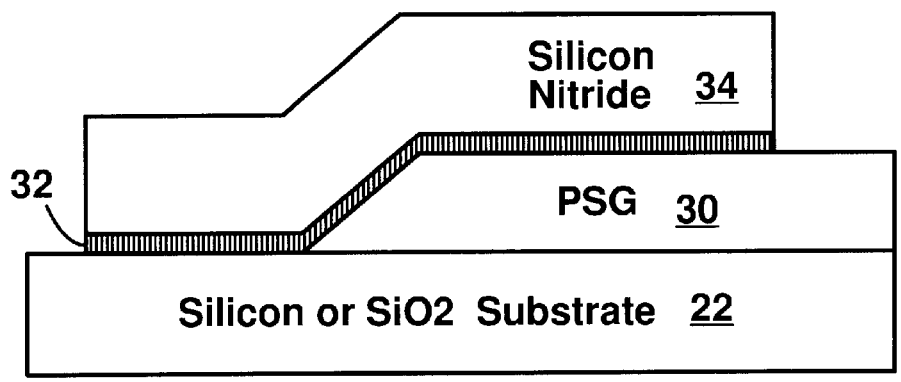

Next, in FIG. 5d, photoresist (not shown) is deposited and patterned, and reactive ion etching is used to remove silicon nitride and polysilicon from selected areas. This step exposes the PSG 30.

Figure 5E:
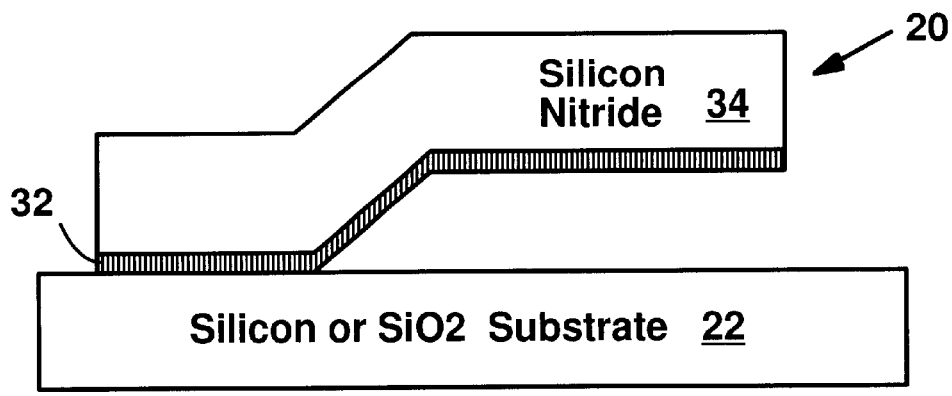

Finally, in FIG. 5e, the PSG 30 is removed in a release step. This can be performed in a fluorine-containing plasma, or using wet-etching techniques. A freestanding, released cantilever is provided after the release step.

Figure 6:
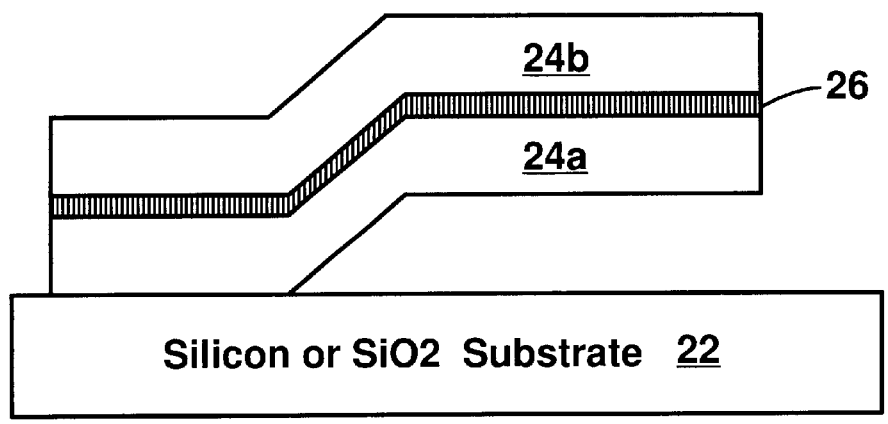
FIG. 6 shows an alternative embodiment with a conductive polysilicon layer disposed within the silicon nitride layer.

FIG. 6 shows an alternative embodiment of the present invention where the conductive polysilicon layer 26 is disposed within the silicon nitride layer (dividing it into two 'sublayers' 24a, 24b). This structure can be easily made by first depositing silicon nitride, followed by polysilicon, and then more silicon nitride. All the layers can be deposited in the same LPCVD step by adjusting gas composition. In this embodiment, the aggregate thickness of the two sublayers 24a, 24b should be at least 5 times the thickness of the conductive polysilicon layer. More preferably, the aggregate thickness of the silicon nitride sublayers 24a, 24b are 10, 20, 50, or 100 times as thick as the conductive polysilicon layer 26. Also preferably, the sublayers 24a, 24b have approximately equal thickness.

Figure 7:
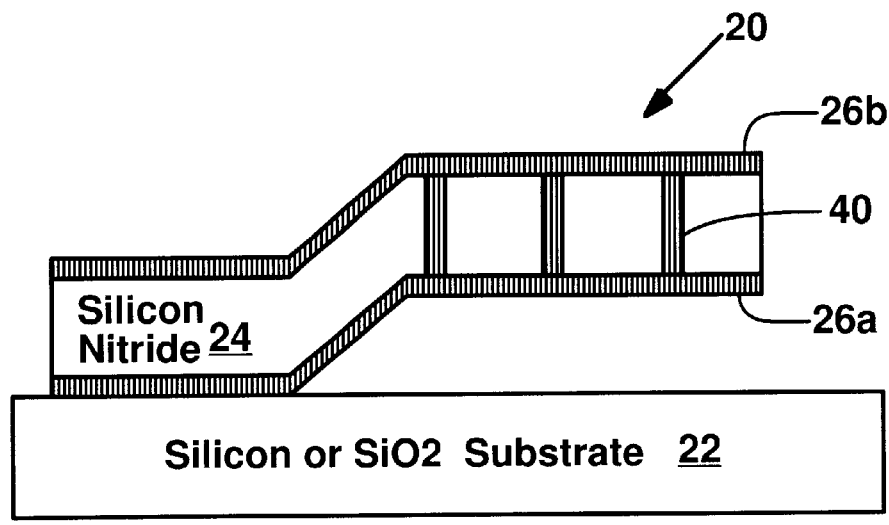
FIG. 7 shows an alternative embodiment of the present invention having vias for electrically connecting top and bottom polysilicon layers.

FIG. 7 shows yet another embodiment of the present invention having top and bottom polysilicon layers 26a, 26b that are electrically coupled by via holes 40 through the silicon nitride layer 24. The videos can be made by reactive ion etching through the silicon nitride 24 before the deposition of the top polysilicon layer 26b. Conductive polysilicon within the via holes 40 provides electrical connection between the top and bottom surfaces.

Figure 8:
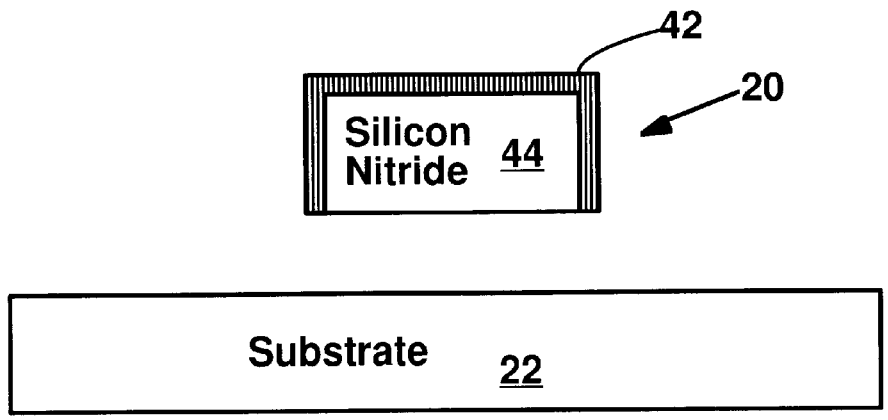
FIG. 8 shows a cross sectional view of a cantilever of the present invention having a conductive polysilicon layer on the top surface and sidewalls.

FIG. 8 shows yet another embodiment of the present invention where a thin, conductive polysilicon layer 42 is conformally deposited on silicon nitride 44 after the silicon nitride layer is etched. The view of FIG. 8 is a cross-sectional view perpendicular to the length of the cantilever 20. In this embodiment, the conductive polysilicon layer 42 covers the top surface and sidewalls of the silicon nitride 44.

Figure 9A:
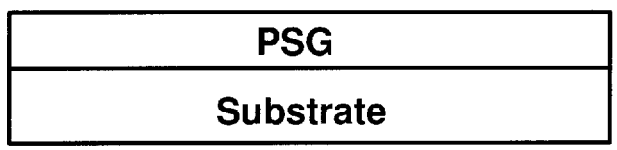
FIGS. 9a–9f illustrate a method for making the cantilever shown in FIG. 8.
Figure 9B:
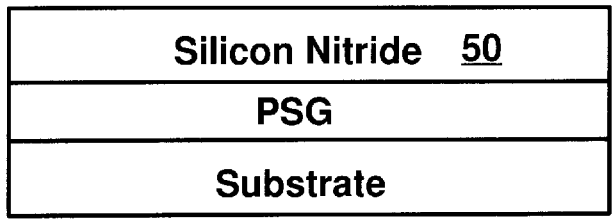
Figure 9C:
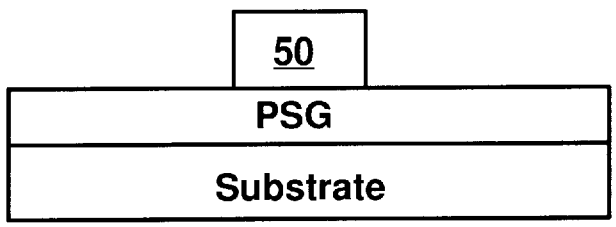
Figure 9D:
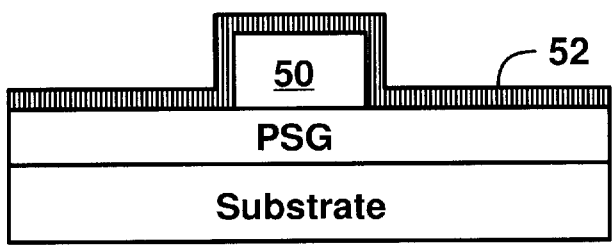
Figure 9E:
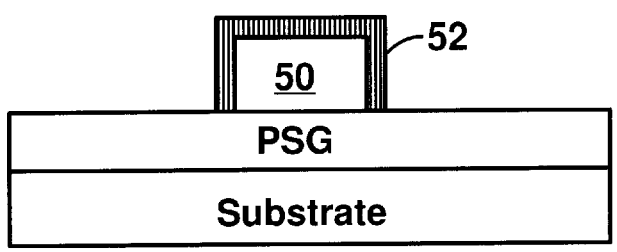
Figure 9F:
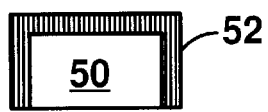
Figure 9F:
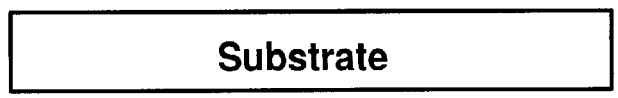

FIGS. 9a–9f illustrate a preferred method for making the cantilever shown in FIG. 8. First, in FIG. 9a, PSG is deposited and patterned on a substrate. Next, a silicon nitride layer 50 is deposited on the PSG using LPCVD. In FIG. 9c, the silicon nitride layer 50 is etched using reactive ion etching. Alternatively, vias are also etched in the silicon nitride layer during this step. Next, in FIG. 9d, a conductive polysilicon layer 52 is conformally deposited using LPCVD. Next, in FIG. 9e, the polysilicon is etched from the PSG using resist patterning and then reactive ion or other etching techniques. Finally, in FIG. 9f, the PSG is removed, releasing the cantilever. In this embodiment, the polysilicon layer thickness should be less than $\frac{1}{5}$ of a width of the silicon nitride.

Figure 10:
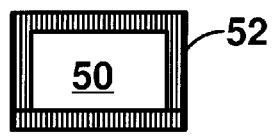
FIG. 10 shows an embodiment of the present invention where the silicon nitride layer is enclosed with conductive polysilicon.

Alternatively, a polysilicon layer is deposited before the silicon nitride layer 50 is deposited so that the cantilever 20 is completely enclosed by conductive polysilicon. FIG. 10 shows a cross sectional view of a cantilever completely enclosed by polysilicon.

Figure 11:
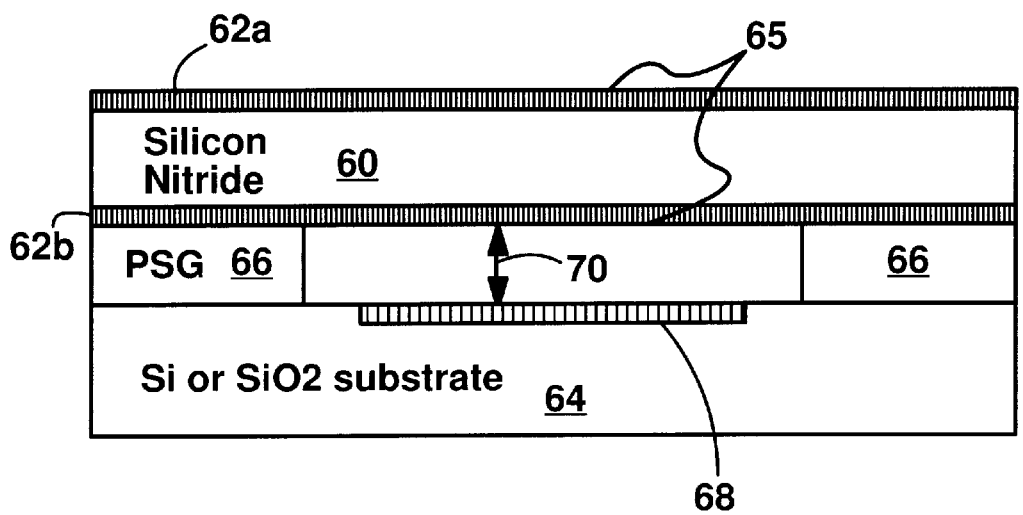
FIG. 11 shows a particularly useful application of the present invention for a microelectrooptomechanical variable reflector.

FIG. 11 shows a particularly useful application of the present invention. A silicon nitride layer 60 and conductive polysilicon layers 62a, 62b are suspended above a substrate 64 by PSG 66 or similar material. The silicon nitride layer and polysilicon layers comprise a diaphragm 65. Conductive pad 68 is disposed below the diaphragm 65. The conductive pad can be a doped region of a silicon substrate, for example. Applying a voltage between the polysilicon layers 62a, 62b and the conductive pad moves the diaphragm up or down, changing a gap distance 70.

In a particularly useful application of the present invention, thicknesses of the silicon nitride layer 60 and polysilicon layers 62a–b are selected so that the diaphragm 65 has a $\frac{1}{4}$ wavelength thickness for a certain optical wavelength. This allows the device to be used as an electrostatically-controlled variable optical reflector. The gap distance 70 determines the reflectivity. The conductive polysilicon layers provide for rapid electrostatic charge dissipation so that the device can operate at high frequency. It is preferable for the diaphragm to have top and bottom polysilicon layers as shown, but the diaphragm can optionally have a single top or bottom polysilicon layer.

It is noted that the boundary between the polysilicon layer and the silicon nitride layer may not be well-defined. This is particularly true in embodiments where gas composition is changed relatively slowly during CVD deposition. In this case, the boundary between the silicon nitride layer and polysilicon layer (for purposes of determining layer thicknesses) is defined as where the silicon/nitrogen ratio is 1/2.

It will be appreciated by those skilled in the art of surface micromachining that many other more complex structures can be made according to the present invention. For example, electrostatic motors, comb drives and other devices comprising silicon nitride with an attached conductive polysilicon layer can fall within the scope of the present invention. In such devices, the polysilicon can provide the conductivity necessary for operation.

It is also noted that the microstructures of the present invention are not necessarily released by etching PSG. Microstructures according to the present invention can be released by bulk micromachining (e.g. anisotropic wet etching) of the substrate material.

It will be clear to one skilled in the art that the above embodiment may be altered in many ways without departing from the scope of the invention. Accordingly, the scope of the invention should be determined by the following claims and their legal equivalents.

What is claimed is:

1. A micromachined apparatus comprising:
   a) a substrate;
   b) a released microstructure disposed on the substrate, comprising:
      1) a silicon nitride layer having a thickness;
      2) a first conductive polysilicon layer attached to the silicon nitride layer, wherein the polysilicon layer has a thickness less than $\frac{1}{5}$ the silicon nitride layer thickness.

2. The apparatus of claim 1 wherein the polysilicon layer thickness is less than $\frac{1}{10}$ the silicon nitride layer thickness.

3. The apparatus of claim 1 wherein the polysilicon layer thickness is less than $\frac{1}{20}$ the silicon nitride layer thickness.

4. The apparatus of claim 1 wherein the polysilicon layer thickness is less than $\frac{1}{30}$ the silicon nitride layer thickness.

5. The apparatus of claim 1 wherein the polysilicon layer thickness is less than $\frac{1}{50}$ the silicon nitride layer thickness.

6. The apparatus of claim 1 wherein the polysilicon layer thickness is less than $\frac{1}{100}$ the silicon nitride layer thickness.

7. The apparatus of claim 1 wherein the silicon nitride layer thickness is in the range of 2–50 microns, and wherein the polysilicon layer thickness is in the range of 1–1000 nanometers.

8. The apparatus of claim 1 wherein the silicon nitride layer thickness is in the range of 3–50 microns, and wherein the polysilicon layer thickness is in the range of 1–100 nanometers.

9. The apparatus of claim 1 wherein the silicon nitride layer thickness is in the range of 5–50 microns, and wherein the polysilicon layer thickness is in the range of 5–50 nanometers.

10. The apparatus of claim 1 wherein the polysilicon layer has a dopant concentration of at least $10^{17}$ atoms per cubic centimeter.

11. The apparatus of claim 1 wherein the polysilicon layer has a dopant concentration of at least $10^{18}$ atoms per cubic centimeter.

12. The apparatus of claim 1 wherein the silicon nitride layer and the polysilicon layer are LPCVD-deposited layers.

13. The apparatus of claim 1 wherein the conductive polysilicon layer is disposed within the silicon nitride layer so that the silicon nitride layer comprises two sublayers.

14. The apparatus of claim 13 wherein the two sublayers have equal thickness.

15. The apparatus of claim 1 further comprising a second conductive polysilicon layer attached to the silicon nitride layer, wherein the second polysilicon layer has a thickness less than ⅕ the silicon nitride layer thickness, and wherein the silicon nitride layer is sandwiched between the first polysilicon layer and the second polysilicon layer.

16. The apparatus of claim 15 wherein the second polysilicon layer thickness is less than ¹⁄₁₀ the silicon nitride layer thickness.

17. The apparatus of claim 15 wherein the second polysilicon layer thickness is less than ¹⁄₅₀ the silicon nitride layer thickness.

18. The apparatus of claim 15 wherein the first polysilicon layer thickness and the second polysilicon layer thickness are equal.

19. The apparatus of claim 1 comprising a transition region with intermediate composition between the silicon nitride layer and the polysilicon layer.

20. The apparatus of claim 1 wherein the silicon nitride layer has a via hole.

21. The apparatus of claim 1 wherein the silicon nitride layer has a sidewall and the conductive polysilicon layer covers the sidewall of the silicon nitride layer.

22. The apparatus of claim 1 wherein the silicon nitride layer is enclosed by the conductive polysilicon layer.

23. The apparatus of claim 1 wherein the microstructure is in the shape of a cantilever and is attached to the substrate.

24. The apparatus of claim 1 wherein the silicon nitride layer has an internal stress in the range of −300 to +300 megaPascals.

25. A micromachined apparatus comprising:
a substrate;
a released microstructure disposed over said substrate, including:
    a silicon nitride layer having a thickness; and
    a conductive polysilicon layer attached to the silicon nitride layer, wherein said conductive polysilicon layer has a thickness less than ⅕ the silicon nitride layer thickness; and
wherein said released microstructure is capable of being deflected by an electrostatic force applied to said conductive polysilicon layer.

26. The micromachined apparatus of claim 25 further comprising a conductive pad disposed on said substrate and electrostatically coupled to said conductive polysilicon layer.

27. The micromachined apparatus of claim 25 wherein said conductive polysilicon layer is positioned between said substrate and said silicon nitride layer.

28. The micromachined apparatus of claim 25 wherein said silicon nitride layer is positioned between said conductive polysilicon layer and said substrate.

29. The micromachined apparatus of claim 28 further comprising a second conductive polysilicon layer positioned between said substrate and said silicon nitride layer.

30. The micromachined apparatus of claim 29 further comprising at least one via extending between said conductive polysilicon layers.

31. A micromachined apparatus comprising:
a substrate;
a cantilevered microstructure disposed over said substrate, comprising:
    a silicon nitride layer;
    a conductive polysilicon layer attached to the silicon nitride layer, the
        polysilicon layer having a thickness less than ⅕ the silicon nitride
        layer thickness; and
    a conductive pad disposed on said substrate and electrostatically coupled to
        said conductive polysilicon layer;
wherein said cantilevered microstructure is capable of being deflected by an electrostatic force applied to said conductive polysilicon layer.

32. The micromachined apparatus of claim 31 wherein said conductive polysilicon layer is positioned between said substrate and said silicon nitride layer.

33. The micromachined apparatus of claim 31 wherein said silicon nitride layer is positioned between said conductive polysilicon layer and said substrate.

34. The micromachined apparatus of claim 33 further comprising a second conductive polysilicon layer positioned between said substrate and said silicon nitride layer.

35. The micromachined apparatus of claim 34 further comprising at least one via extending between said conductive polysilicon layers.

36. The apparatus as recited in claim 1, wherein the polysilicon layer covers the silicon nitride layer and has the same length as the silicon nitride layer.

* * * * *